(12) United States Patent
Saleem et al.

(10) Patent No.: US 12,665,544 B2
(45) Date of Patent: *Jun. 23, 2026

(54) SOLAR PANEL ASSEMBLY METHOD

(71) Applicant: Imam Abdulrahman Bin Faisal University, Dammam (SA)

(72) Inventors: Muhammad Saleem, Dammam (SA); Abdulrahman Magdi Marzouk, Dammam (SA); Mohammed Alqhtani, Dammam (SA); Abdulmalik Almakytah, Dammam (SA)

(73) Assignee: Imam Abdulrahman Bin Faisal University, Dammam (SA)

( * ) Notice: Subject to any disclaimer, the term of this patent is extended or adjusted under 35 U.S.C. 154(b) by 0 days.

This patent is subject to a terminal disclaimer.

(21) Appl. No.: 19/220,156

(22) Filed: May 28, 2025

(65) Prior Publication Data

US 2025/0286508 A1 Sep. 11, 2025

Related U.S. Application Data

(60) Continuation of application No. 18/487,310, filed on Oct. 16, 2023, now Pat. No. 12,348,184, which is a
(Continued)

(51) Int. Cl.
*H02S 40/36* (2014.01)
*H01R 12/79* (2011.01)
(Continued)

(52) U.S. Cl.
CPC ............. *H02S 40/36* (2014.12); *H01R 12/79* (2013.01); *H02S 30/10* (2014.12); *H10F 19/85* (2025.01); *H10F 19/902* (2025.01)

(58) Field of Classification Search
CPC ................................. H02S 30/10; H02S 40/36
See application file for complete search history.

(56) References Cited

U.S. PATENT DOCUMENTS 4,233,085 A 11/1980 Roderick
10,340,836 B2 7/2019 Seery
(Continued)

FOREIGN PATENT DOCUMENTS

DE 202013005015 U1 4/2014
JP 3633944 B2 3/2005
KR 20130098695 A 9/2013

OTHER PUBLICATIONS

Majdi, et al. ; Fundamental study related to the development of modular solar panel for improved durability and repairability ; IET Renewable Power Generation ; Oct. 28, 2020 ; 15 Pages.
(Continued)

*Primary Examiner* — Christina Chern
(74) *Attorney, Agent, or Firm* — Oblon, McClelland, Maier & Neustadt, L.L.P.

(57) ABSTRACT

A modular solar panel including multiple solar panel modules. Each solar panel module includes a solar cell assembly. The solar cell assembly includes a protective glass, a base plate, a solar cell array located therebetween, and an electrical connection ribbons extending from the ends of the solar cell array. The solar panel module further includes one or more coupling modules. Each coupling module includes an interior cavity to receive one end of the solar cell assembly, two or more magnets removably embedded in the coupling module, a pin joint located on exterior of a first coupling module to interlock with a pin joint located on exterior of a second coupling module, and an electrical connection plug to receive one of the first and the second electrical connection ribbons. The electrical connection plug of the first coupling module electrically connects with an electrical connection plug of the second coupling module.

8 Claims, 12 Drawing Sheets

Related U.S. Application Data division of application No. 17/230,291, filed on Apr. 14, 2021, now Pat. No. 11,817,821.

(51) Int. Cl.
  *H02S 30/10*    (2014.01)
  *H10F 19/85*    (2025.01)
  *H10F 19/90*    (2025.01)

(56)            References Cited

U.S. PATENT DOCUMENTS

| 2015/0107651 | A1 | 4/2015 | Cinnamon |
| 2015/0311371 | A1 | 10/2015 | Krishnamoorthy |
| 2016/0087578 | A1 | 3/2016 | Cinnamon |
| 2020/0036326 | A1 | 1/2020 | Chapman |
| 2020/0274483 | A1 | 8/2020 | Sanglap |

OTHER PUBLICATIONS

English machine translation of Toshito et al. (JP 3633944) published Mar. 2005.
English machine translation of Sonnenrepublik (DE 202013005015) published Apr. 2014.
English machine translation of Hee (KR 2013-0098695) published Sep. 5, 2013.

Section C1-C1'

Section C2-C2'

Section C3-C3'

Section C4-C4'

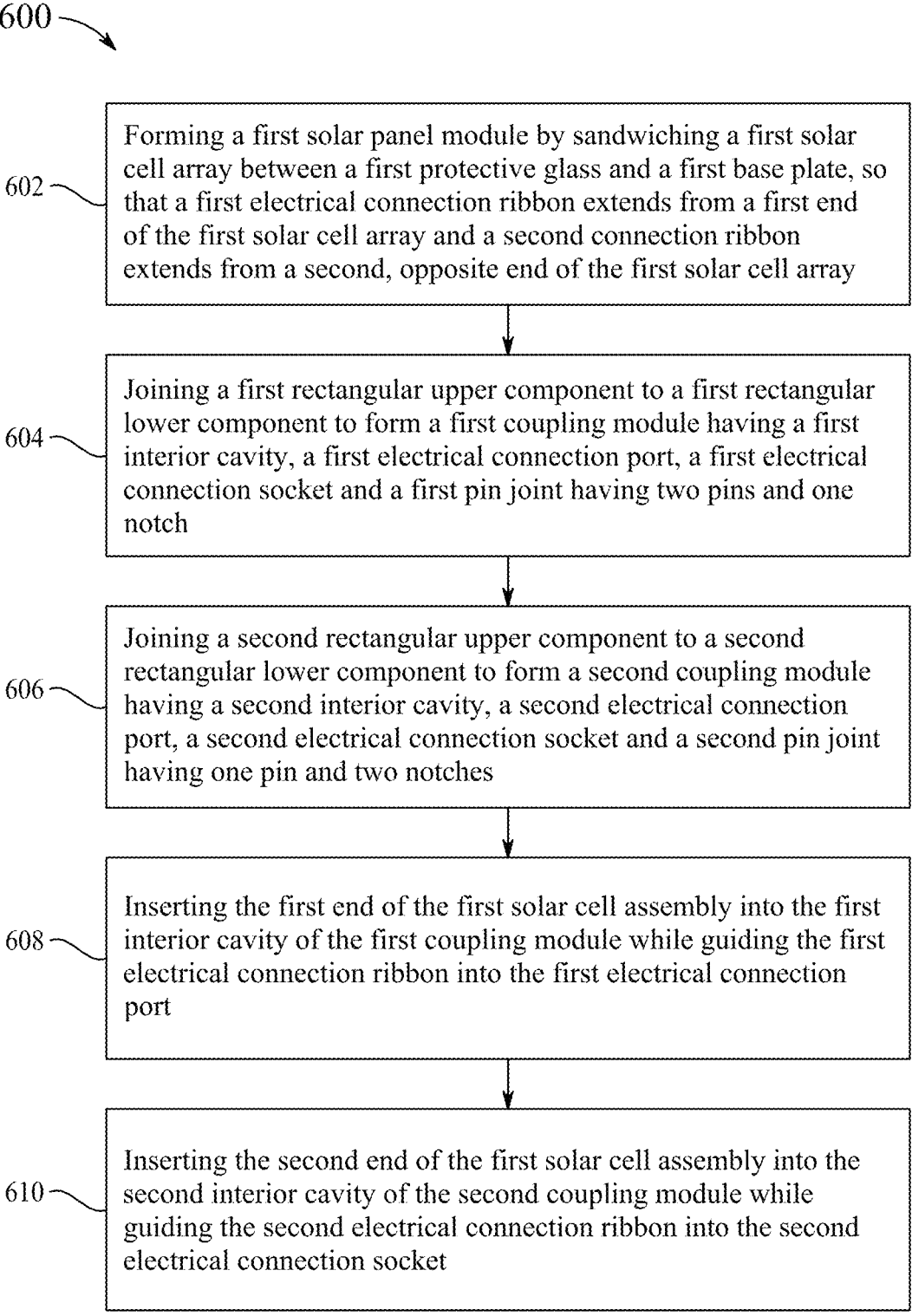

600

602 — Forming a first solar panel module by sandwiching a first solar cell array between a first protective glass and a first base plate, so that a first electrical connection ribbon extends from a first end of the first solar cell array and a second connection ribbon extends from a second, opposite end of the first solar cell array 604 — Joining a first rectangular upper component to a first rectangular lower component to form a first coupling module having a first interior cavity, a first electrical connection port, a first electrical connection socket and a first pin joint having two pins and one notch 606 — Joining a second rectangular upper component to a second rectangular lower component to form a second coupling module having a second interior cavity, a second electrical connection port, a second electrical connection socket and a second pin joint having one pin and two notches 608 — Inserting the first end of the first solar cell assembly into the first interior cavity of the first coupling module while guiding the first electrical connection ribbon into the first electrical connection port 610 — Inserting the second end of the first solar cell assembly into the second interior cavity of the second coupling module while guiding the second electrical connection ribbon into the second electrical connection socket

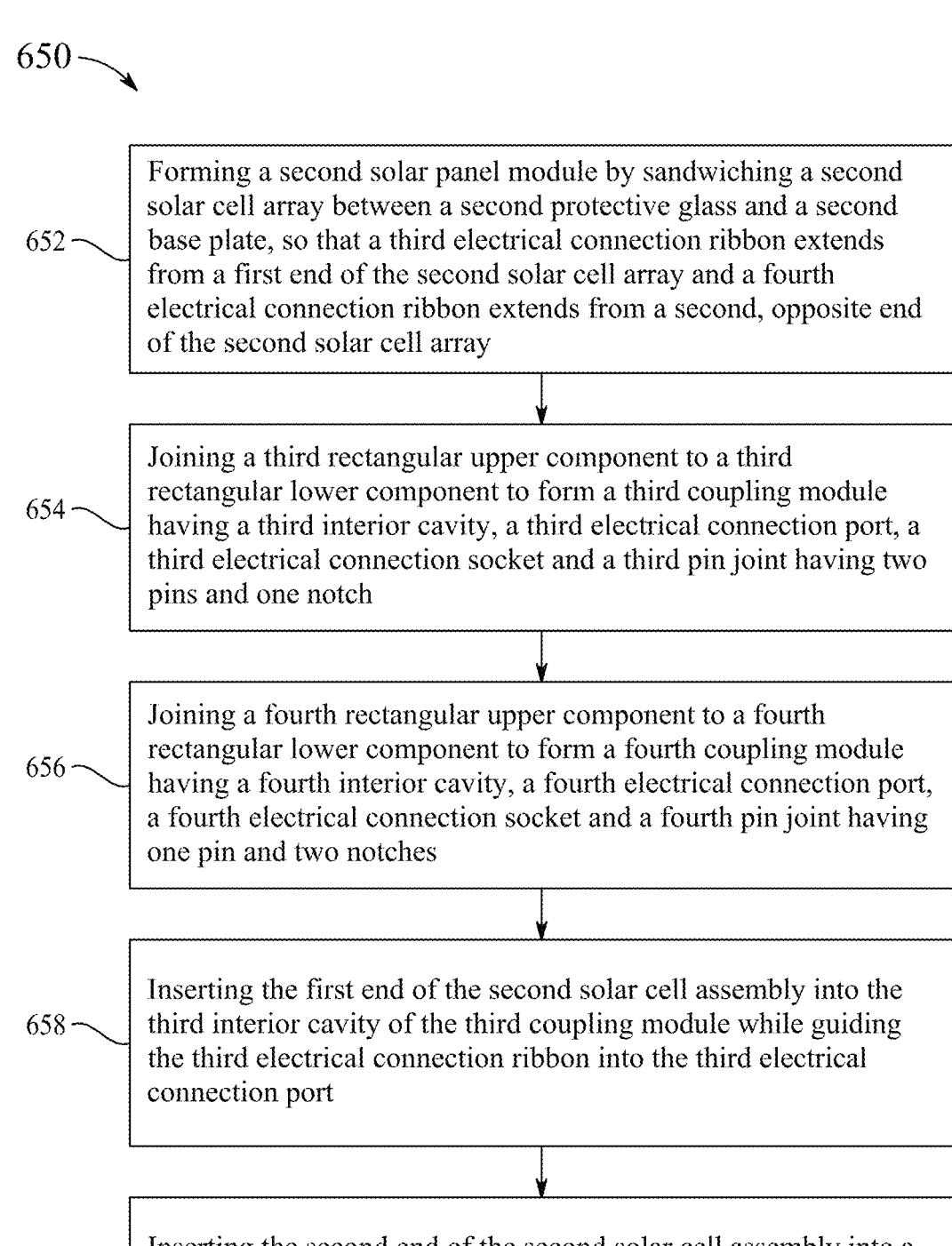

652 — Forming a second solar panel module by sandwiching a second solar cell array between a second protective glass and a second base plate, so that a third electrical connection ribbon extends from a first end of the second solar cell array and a fourth electrical connection ribbon extends from a second, opposite end of the second solar cell array 654 — Joining a third rectangular upper component to a third rectangular lower component to form a third coupling module having a third interior cavity, a third electrical connection port, a third electrical connection socket and a third pin joint having two pins and one notch 656 — Joining a fourth rectangular upper component to a fourth rectangular lower component to form a fourth coupling module having a fourth interior cavity, a fourth electrical connection port, a fourth electrical connection socket and a fourth pin joint having one pin and two notches 658 — Inserting the first end of the second solar cell assembly into the third interior cavity of the third coupling module while guiding the third electrical connection ribbon into the third electrical connection port 660 — Inserting the second end of the second solar cell assembly into a fourth interior cavity of a fourth coupling module while guiding the fourth electrical connection ribbon into the fourth electrical connection port socket

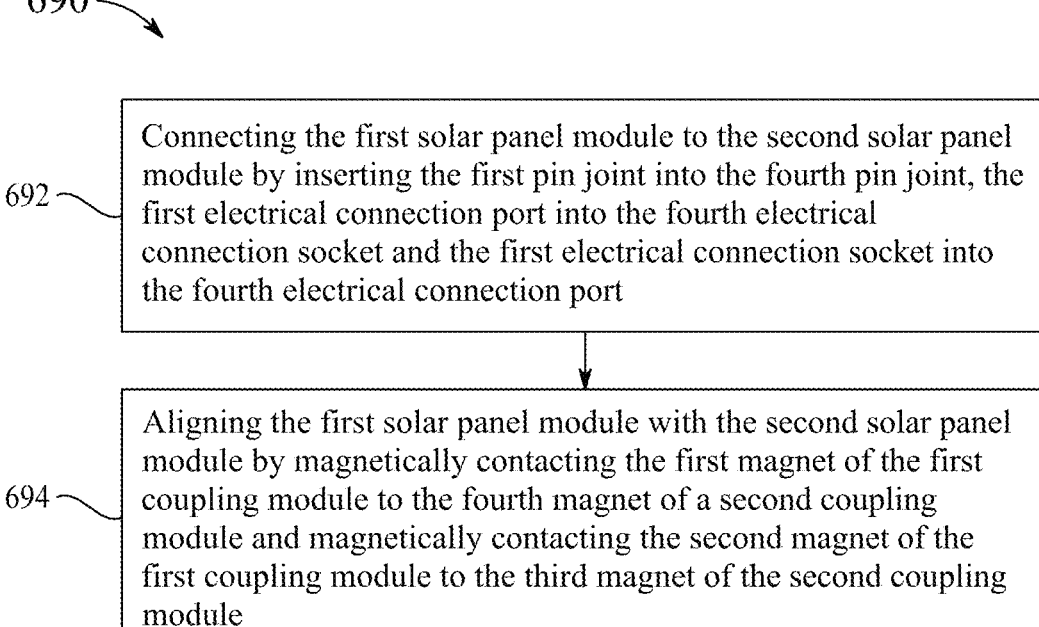

692 — Connecting the first solar panel module to the second solar panel module by inserting the first pin joint into the fourth pin joint, the first electrical connection port into the fourth electrical connection socket and the first electrical connection socket into the fourth electrical connection port 694 — Aligning the first solar panel module with the second solar panel module by magnetically contacting the first magnet of the first coupling module to the fourth magnet of a second coupling module and magnetically contacting the second magnet of the first coupling module to the third magnet of the second coupling module

*FIG. 6C*

SOLAR PANEL ASSEMBLY METHOD

CROSS-REFERENCE TO RELATED APPLICATIONS

The present application is a Continuation of U.S. application Ser. No. 18/487,310, now allowed, having a filing date of Oct. 16, 2023 which is a Division of U.S. application Ser. No. 17/230,291, now U.S. Pat. No. 11,817,821 having a filing date of Apr. 14, 2021.

STATEMENT REGARDING PRIOR DISCLOSURE BY THE INVENTORS

Aspects of this technology are described in an article "Fundamental study related to the development of modular solar panel for improved durability and repairability" published in IET Renewable Power Generation, Oct. 28, 2020, which is incorporated herein by reference in its entirety.

BACKGROUND

Technical Field

The present disclosure is directed to a modular solar panel design for improved durability and repairability and a method of assembling the modular solar panel.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

With an increase in need for renewable energy sources, harvesting electrical power from solar energy is being widely practiced due to vast abundance, free availability, and ease of use. Typically, solar power generation involves installing large solar panels on rooftops or terraces of buildings. The solar panels absorb solar radiation and convert the absorbed energy into electricity which can be used to power multiple applications. However, to address the high demand of electricity, large sized, multiple solar panels may need to be used and installation of such solar panels can be complex and difficult. Generally, a mounting system is used to secure the solar panels, where each solar panel is rigidly affixed to neighboring solar panels. In such an arrangement, it is important to retain alignment of each solar panel with the neighboring solar panels to ensure the electrical connections are completed.

U.S. Patent Application Publication No. 2015/0311371 provides modular, expandable, and interconnectable solar photovoltaic appliances that can be connected to each other and other derivative products in multiple series and parallel configurations to supply a specific amount of electrical power to an application requiring electrical energy. However, the photovoltaic appliances are connected to each other using appliance connectors which include male connectors and female connectors made of sheet metal strips. Such appliance connectors render an assembly process of the photovoltaic appliances complex.

U.S. Patent Application Publication No. 2016/0087578 describes a design for solar panel that allows for modular installation and efficient removal of panels irrespective of the panel's relative location in an array arrangement. Multiple panels are mechanically coupled using multiple splices to form the array arrangement. The presence of such multiple splices adds to the complexity of the overall installation of the panels.

Each of the aforementioned patent reference suffers from one or more drawbacks hindering their adoption. For example, the design of modular solar panels described by the references renders the system complex and less cost effective. Accordingly, it is one object of the present disclosure to provide methods and systems for achieving improved durability and repairability of the modular solar panels which are easily installed and in which a single unit can be easily replaced.

SUMMARY

In an exemplary embodiment, a modular solar panel is described. The modular solar panel includes a plurality of solar panel modules. Each solar panel module includes a solar cell assembly. Each solar cell assembly includes a protective glass, a base plate, a solar cell array located between the protective glass and the base plate, and a first electrical connection ribbon and a second electrical connection ribbon extending from a first end and a second end of the solar cell array. The solar panel module further includes one or more coupling modules. Each coupling module includes an interior cavity configured to receive an end of the solar cell assembly, two or more magnets removably embedded in the coupling module, a pin joint located on an exterior of the coupling module, where the pin joint of a first coupling module is configured to interlock with the pin joint of a second coupling module. Each coupling module also includes an electrical connection port configured to receive one of the first and the second electrical connection ribbons. The electrical connection port of the first coupling module is configured to electrically connect to the electrical connection port of the second coupling module.

In another exemplary embodiment, a method for assembling a modular solar panel is described. The method includes forming a first solar panel module by forming a first solar cell assembly by sandwiching a first solar cell array between a first protective glass and a first base plate, so that a first electrical connection ribbon extends from a first end of the first solar cell array and a second connection ribbon extends from a second end of the first solar cell array, the second end an opposite end to the first end of the first solar cell array. The method further includes joining a first rectangular upper component to a first rectangular lower component to form a first coupling module having a first interior cavity, a first electrical connection port, a first electrical connection socket and a first pin joint having two pins and one notch. The method further includes joining a second rectangular upper component to a second rectangular lower component to form a second coupling module having a second interior cavity, a second electrical connection port, a second electrical connection socket and a second pin joint having one pin and two notches. The method further includes inserting the first end of the first solar cell assembly into the first interior cavity of the first coupling module while guiding the first electrical connection ribbon into the first electrical connection port and inserting the second end of the first solar cell assembly into the second interior cavity of the second coupling module while guiding the second electrical connection ribbon into the second electrical connection socket.

In another exemplary embodiment, a method for assembling a modular solar panel is described. The method includes forming a plurality of solar panel modules, by forming a plurality of solar cell assemblies. The method further includes forming a plurality of coupling modules, each coupling module including an electrical plug at a first end, an electrical socket at a second end, a pin joint, a first magnet having a first polarity located between the electrical plug and the pin joint, a second magnet having a second polarity located between the electrical socket and the pin joint, and an interior cavity. The method further includes inserting a first end of each of the solar cell assemblies into a first coupling module having a pin joint configuration including two pins and a notch. The method further includes inserting a second end of each of the solar cell assemblies into a second coupling module having a pin joint configuration including one pin and two notches. The method further includes joining a first solar panel module of the plurality of solar panel modules to a second solar panel module of the plurality of solar panel modules by interlocking the two pins and the notch of the first solar panel module into the one pin and two notches of the second solar panel module, and inserting the electrical plug of the first solar panel module into the electrical socket of the second solar panel module, while magnetically aligning the first solar panel module with the second solar panel module.

The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein:

FIG. 6A is a flowchart of a method for assembling the modular solar panel and forming a first solar panel module, according to certain embodiments of the present disclosure;

FIG. 6B is a flowchart of the method for assembling the modular solar panel and forming a second solar panel module, according to certain embodiments of the present disclosure; and FIG. 6C is a flowchart of a method for assembling the modular solar panel with the first solar panel module and the second solar panel module, according to certain embodiments of the present disclosure.

DETAILED DESCRIPTION

Figure 1:
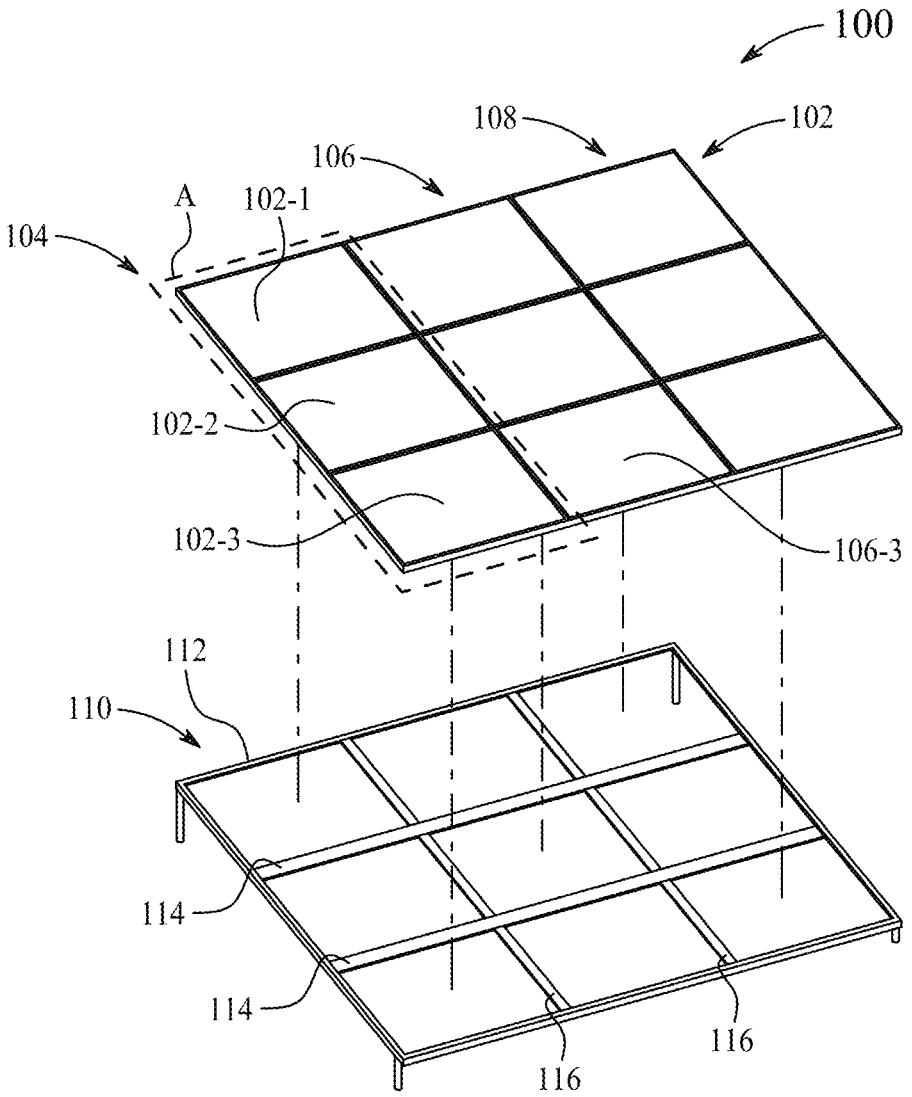
FIG. 1 is an exploded view of a modular solar panel, according to certain embodiments of the present disclosure.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Certain terms used in the present disclosure are for the purpose of reference only and are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Aspects of the present disclosure are directed to a modular solar panel assembly and method for assembling the modular solar panel. Design and construction of the modular solar panel of the present disclosure aids in reducing time required to assemble individual solar panel modules to achieve the modular solar panel assembly. Referring to FIG. 1, an exploded view of a modular solar panel 100 is illustrated. According to an exemplary embodiment, the modular solar panel 100 includes a plurality of solar panel modules 102-1, 102-2, 102-3 . . . , 102-N (hereinafter referred to as "the solar panel module(s) 102") disposed along multiple rows and columns to constitute an array of solar panels modules. As can be seen in FIG. 1, a first column 104 of the modular solar panel 100 includes a first solar panel module 102-1, a second solar panel module 102-2 electrically coupled to the first solar panel module 102-1, and a third solar panel module 102-3 electrically coupled to the second solar panel module 102-2. Similarly, a second column 106 of the modular solar panel 100 and a third column 108 of the modular solar panel 100 are disposed in adjacent order to the first column 104 to constitute the modular solar panel 100. In an embodiment, electrical leads from each column may be combined at a single point to realize electrical power harvested by the modular solar panel 100. In another embodiment, each column may be electrically connected in series to an adjacent column, such that one electrical lead wire may extend from one end of the modular solar panel 100 and another electrical lead wire may extend from a diagonally opposite end of the modular solar panel 100 to realize electrical power harvested by the modular solar panel 100.

FIG. 1 also illustrates a frame 110 made of rigid material, such as, for example, steel, rigid plastic, aluminum or cast iron. The frame 110 includes a body 112, horizontal ribs 114 extending between a first pair of opposite peripheries of the body 112, and vertical ribs 116 extending between a second pair of opposite peripheries of the body 112. A distance between two adjacent horizontal ribs 114 is substantially equal to a length "L" of a solar panel module 102 and a distance between two adjacent vertical ribs 116 is substantially equal to a width "W" of the solar panel module 102. With such configuration of the frame 110, the horizontal ribs 114 are configured to provide support to the solar panel modules 102 at a portion where one solar panel module 102 electrically connects with an adjacent solar panel module 102. Similarly, the vertical ribs 116 are configured to provide support to the solar panel modules 102 at a portion where one solar panel module 102 of the first column 104 abuts an adjacent solar panel module 102 of the adjacent column, such as the second column 106. As such, the horizontal ribs 114 and the vertical ribs 116 prevent sagging of the solar panel modules 102 at the portions of connections with adjacent solar panel modules 102, thereby eliminating the possibility of disconnection between the solar panel modules 102. In some embodiments, the solar panel modules 102 mounted on the frame 110 may together constitute the modular solar panel 100. The number of solar panel modules 102 shown in FIG. 1 is only for purpose of illustration and brevity and should not be considered as limiting. Any number of solar panel modules 102 may be used to form the modular solar panel 100. According to some implementations, the modular solar panel 100 may be located in a solar farm or mounted on a building terrace to harvest the solar energy.

Figure 2A:
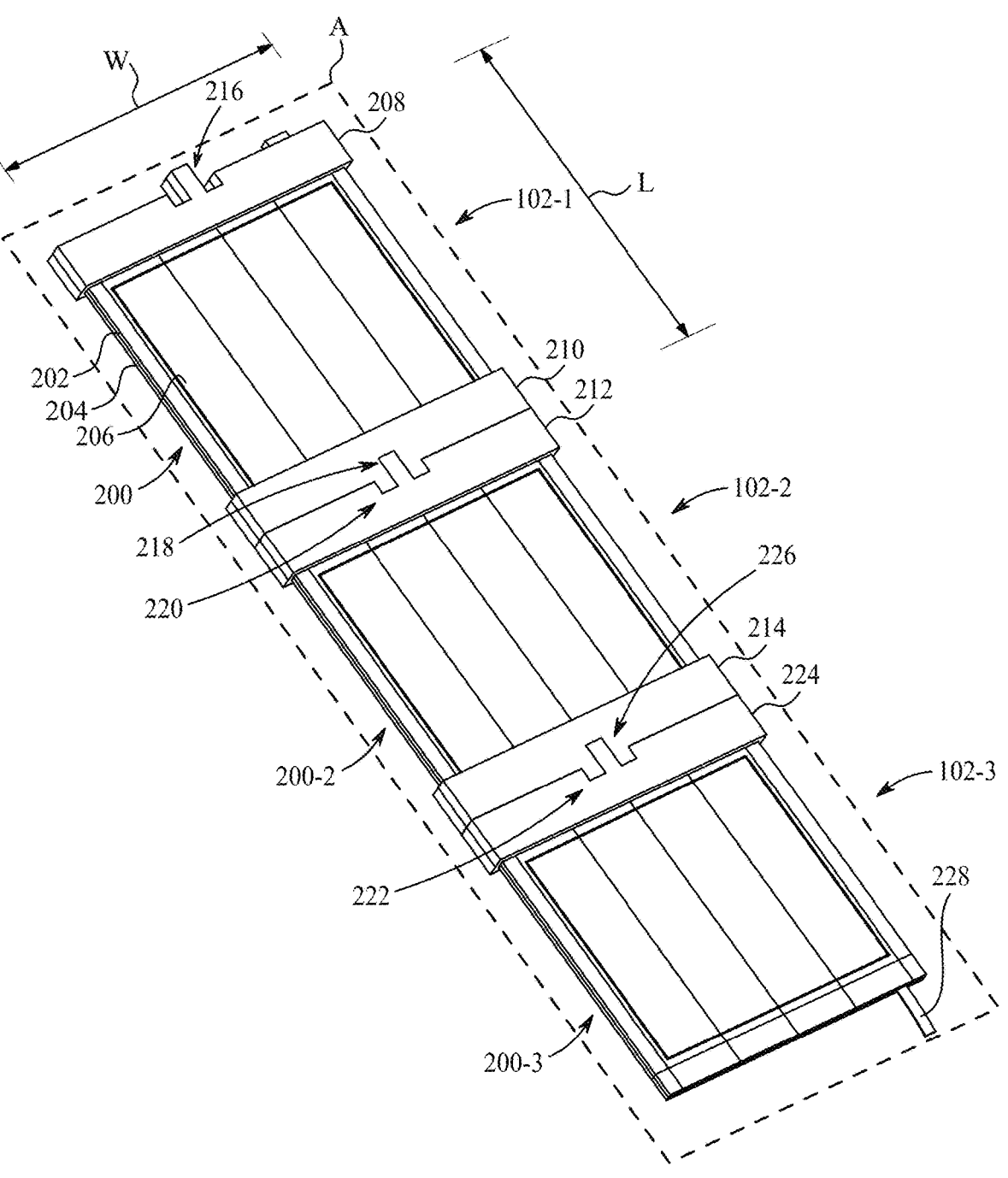
FIG. 2A is an enlarged view of a portion 'A' in FIG. 1 showing a perspective view of two interconnected solar panel modules of the modular solar panel, according to certain embodiments of the present disclosure.

FIG. 2A is an enlarged view of a portion 'A' in FIG. 1 in which a perspective view of three interconnected solar panel modules 102 is shown, such as the first solar panel module 102-1, the second solar panel module 102-2, and the third solar panel module 102-3. According to an exemplary embodiment, each solar panel module 102 includes a solar cell assembly 200 having a protective glass 202, a base plate 204 aligned and located beneath the protective glass 202, and a solar cell array 206 located between the protective glass 202 and the base plate 204. In some embodiments, the protective glass 202 may be transparent to absorb the incident solar radiation and the base plate 204 may be constructed of any one of plastic and synthetic polymer. As used herein, the term "solar cell array" refers to multiple columns of solar cells located along the length of the solar cell assembly 200. Each solar panel module 102 includes one or more coupling modules (208, 210, 212, 214, 224) which aid in interlocking the first solar panel module 102-1 with the second solar panel module 102-2. In some embodiments, each solar panel module 102 includes one or more coupling modules (214, 224) which aid in interlocking the second solar panel module 102-2 with the third solar panel module 102-3. In some embodiments, the third solar panel module 102-3 may only include one coupling module 224 installed on a first end of the assembly 200-3. In some embodiments, the third solar panel module 102-3 may electrically connect with an adjacent solar panel module 106-3 via a second electrical connection ribbon 228 located on a second end of the assembly 200-3.

Figure 2B:
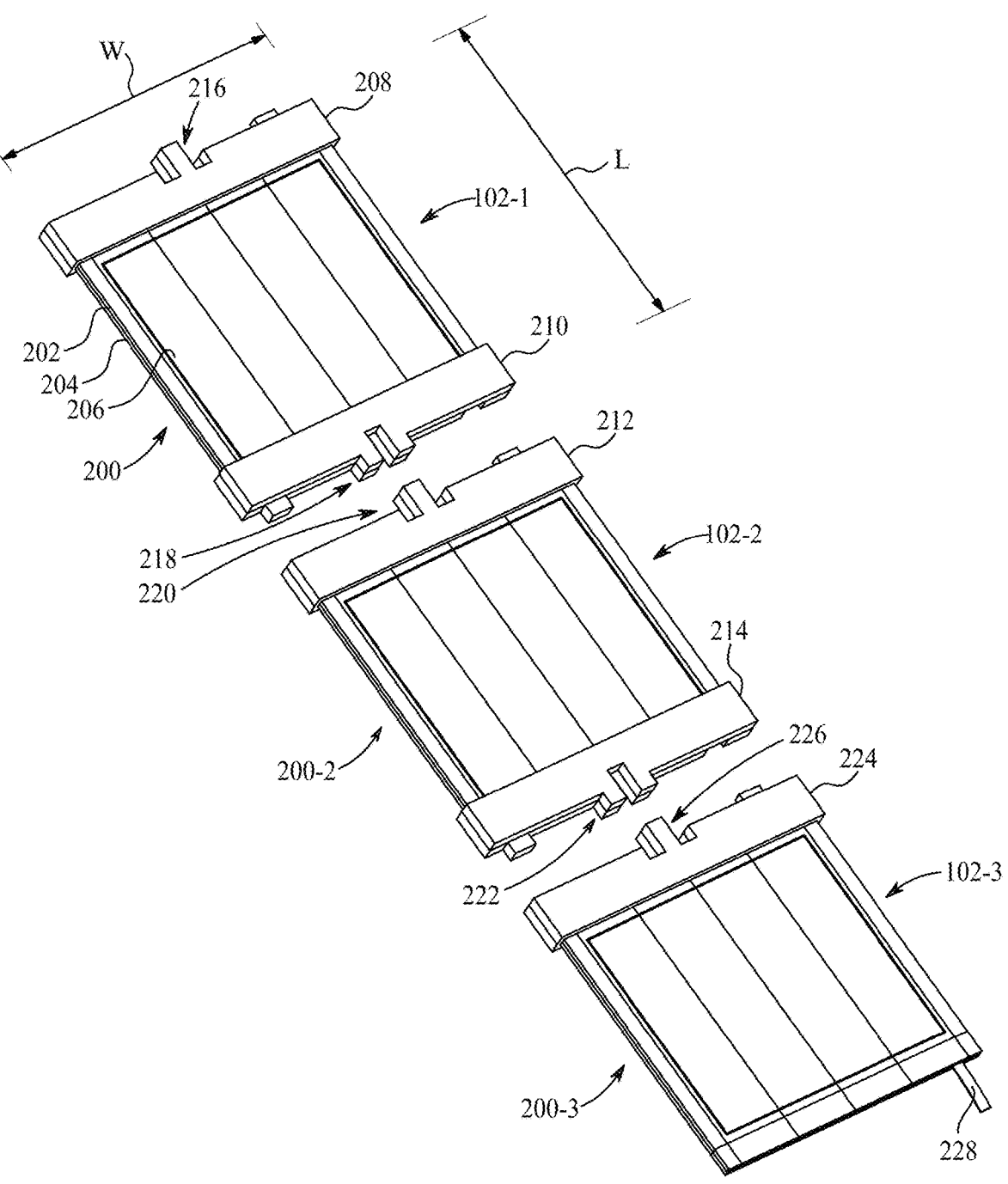
FIG. 2B is a perspective view of the two solar panel modules disconnected from one another, according to certain embodiments of the present disclosure.

FIG. 2B illustrates a perspective view of the first solar panel module 102-1 disconnected from the second solar panel module 102-2, and the second solar panel module 102-2 disconnected from the third solar panel module 102-3. The first solar panel module 102-1 includes a first coupling module 208 and a second coupling module 210, the second solar panel module 102-2 includes a third coupling module

212 and a fourth coupling module 214, and the third solar panel module 102-3 includes a fifth coupling module 224. According to an exemplary embodiment, each coupling module includes a pin joint located on an exterior thereof. For example, in the first solar panel module 102-1, the first coupling module 208 includes a first pin joint 216 (alternatively referred to as "a first pin joint configuration") and the second coupling module 210 includes a second pin joint 218 (alternatively referred to as "a second pin joint configuration"). Similarly, in the second solar panel module 102-2, the third coupling module 212 includes a third pin joint 220 and the fourth coupling module 214 includes a fourth pin joint 222. Similarly, in the third solar panel module 102-3, the fifth coupling module 224 includes a fifth pin joint 226. In such arrangement, the third pin joint 220 of the third coupling module 212 of the second solar panel module 102-2 is configured to interlock with the second pin joint 218 of the second coupling module 210 of the first solar panel module 102-1. In some embodiments, the fifth pin joint 226 of the fifth coupling module 224 of the third solar panel module 102-3 is configured to interlock with the fourth pin joint 222 of the fourth coupling module 214 of the second solar panel module 102-2.

Figure 3:
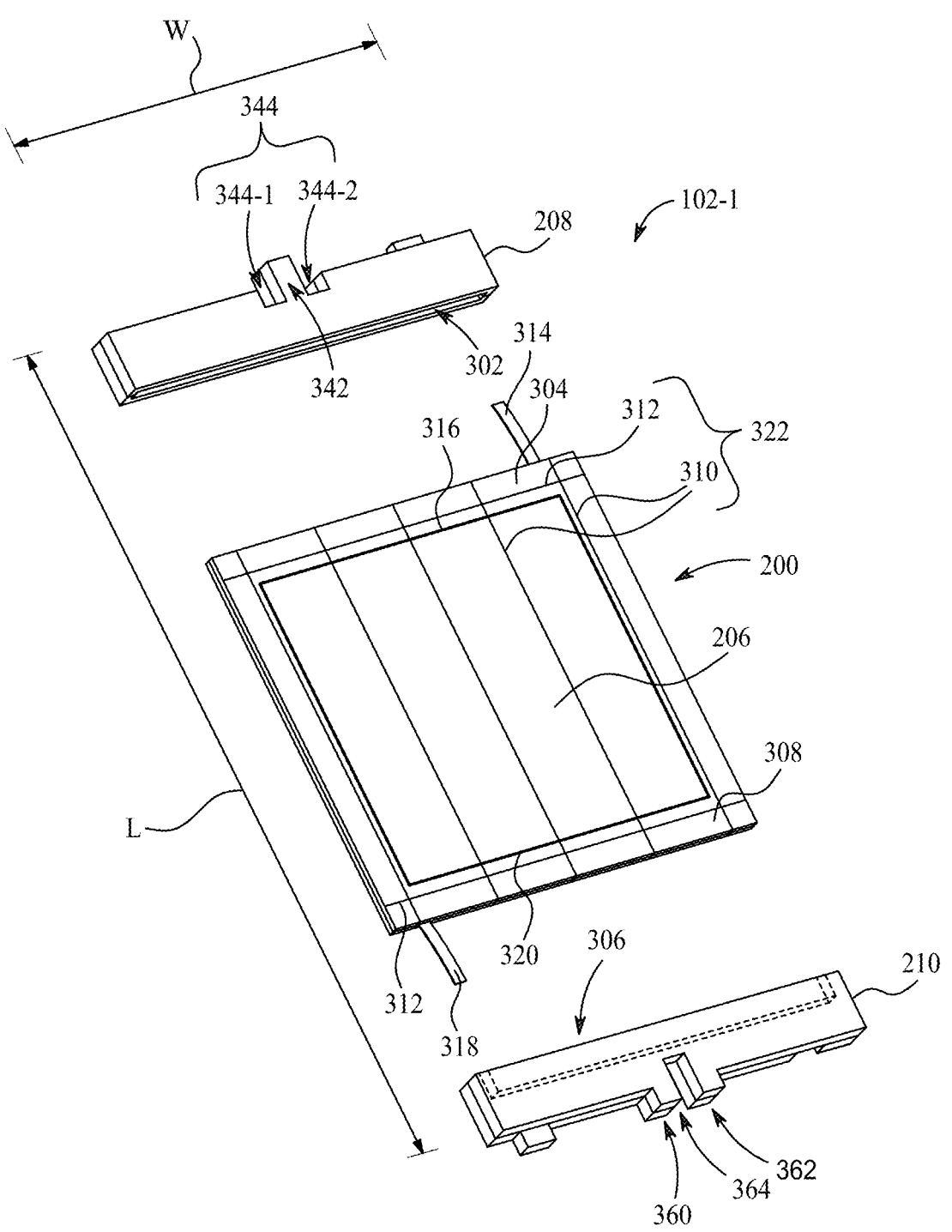
FIG. 3 is an exploded view of a solar panel module, according to certain embodiments of the present disclosure.

FIG. 3 illustrates an exploded view of the first solar panel module 102-1. FIG. 3 will be described in conjunction with FIG. 1 to FIG. 2B. To this end, it will be understood that each solar panel module 102 is identical in construction with respect to the adjacent solar panel modules 102. According to an exemplary embodiment, each coupling module defines an interior cavity configured to receive an end of the solar cell assembly 200. The first coupling module 208 defines a first cavity 302 configured to receive a first end 304 of the solar cell assembly 200 and the second coupling module 210 defines a second cavity 306 configured to receive a second end 308 of the solar cell assembly 200.

According to an exemplary embodiment, the solar cell assembly 200 includes a first set of conducting leads lines 310 extending along the length "L" of the first solar panel module 102-1. The solar cell assembly 200 also includes a second set of conducting lead lines 312 located at the first end 304 and the second end 308 of the solar cell assembly 200 and extending in a direction perpendicular to the length "L" thereof. In some embodiments, the first set of conducting leads lines 310 and the second set of conducting lead lines 312 may be made of, but not limited to, aluminum or copper. Further, the solar cell assembly 200 includes a first electrical connection ribbon 314 extending from a first end 316 of the solar cell array 206 and a second electrical connection ribbon 318 extending from a second end 320 of the solar cell array 206. The first electrical connection ribbon 314 and the second electrical connection ribbon 318 aid in drawing the harvested solar power from the solar cell assembly 200. According to an exemplary embodiment, the first set of conducting leads lines 310 and the second set of conducting lead lines 312 constitute a metal interconnect layer 322 configured to electrically connect the plurality of rows of solar cells (or referred to as "the solar cell array 206") in a series and in a parallel circuit having an input at the first electrical connection ribbon 314 and an output at the second electrical connection ribbon 318.

Figure 4A:
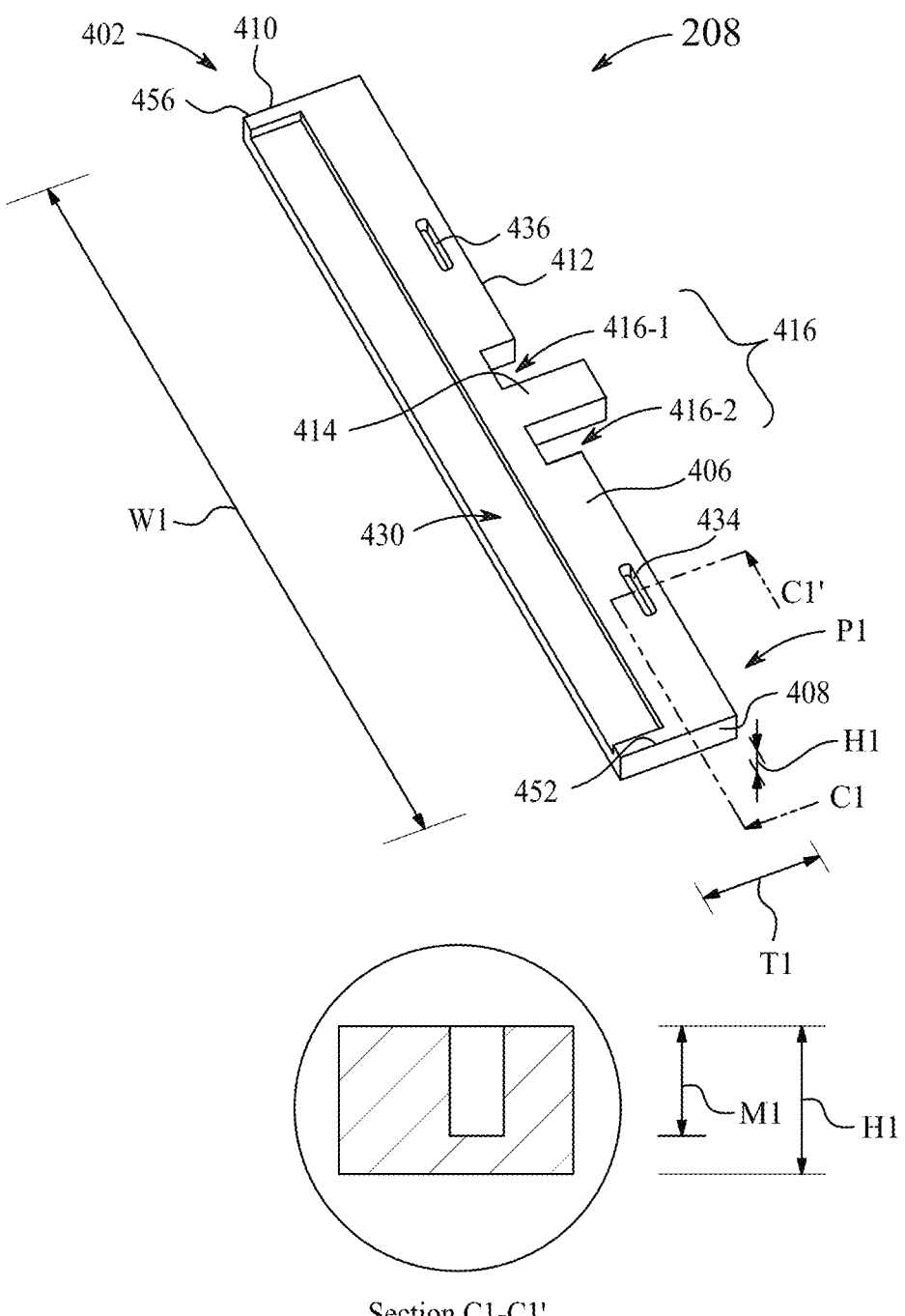
FIG. 4A is a perspective view of a first rectangular upper component of a first coupling module of the solar panel module of FIG. 3, according to certain embodiments of the present disclosure.
Figure 4B:
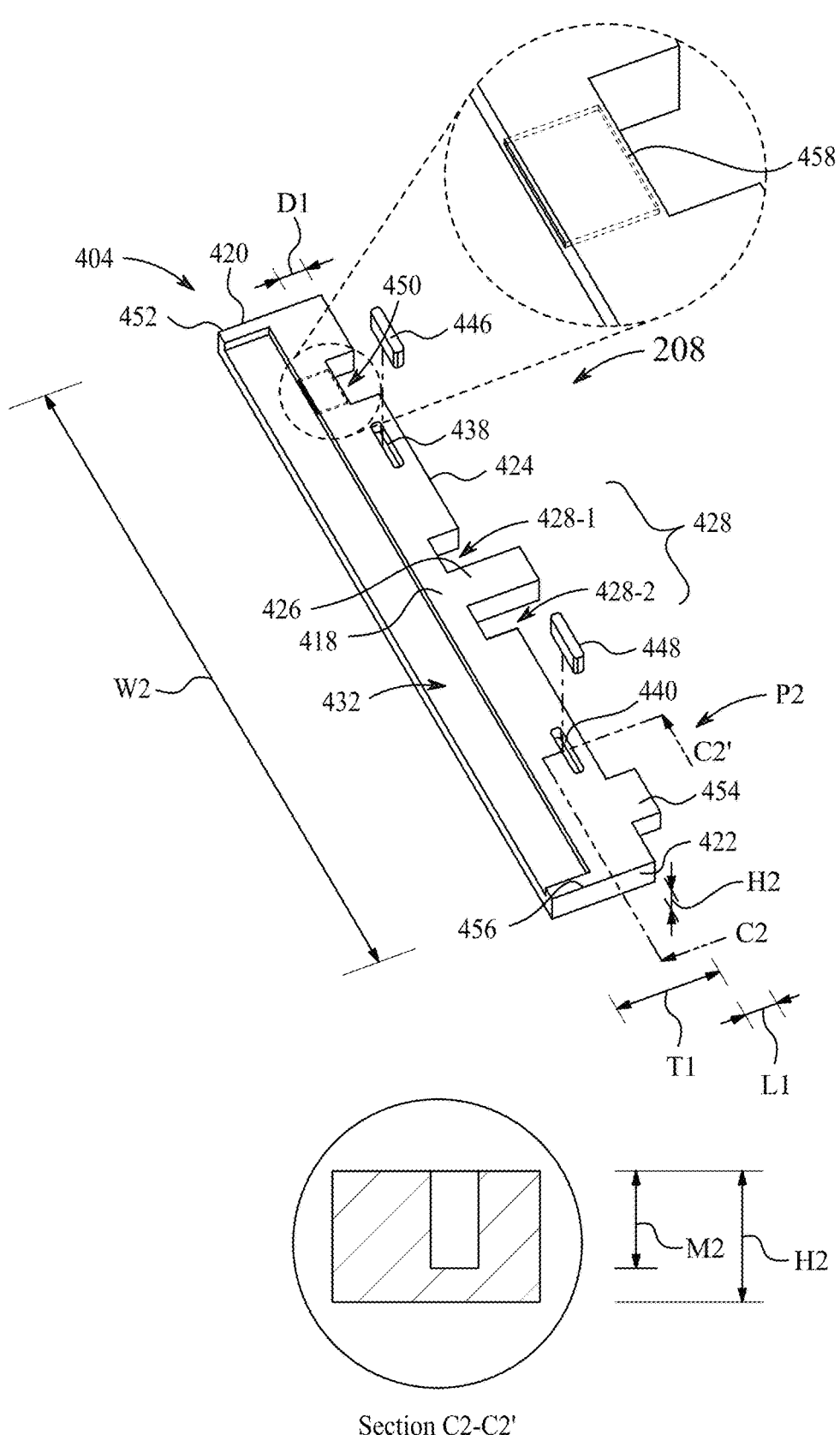
FIG. 4B is an exploded view of a first rectangular lower component of the first coupling module of FIG. 3, according to certain embodiments of the present disclosure.

FIG. 4A and FIG. 4B illustrate components of the first coupling module 208. According to an exemplary embodiment, the first coupling module 208 is constituted by removably coupling two individual components. Particularly, FIG. 4A illustrates a perspective view of a first rectangular upper component 402 of the first coupling module 208 and FIG.

4B illustrates a perspective view of a first rectangular lower component 404 of the first coupling module 208.

The first rectangular upper component 402 includes a first perimeter "P1", a first planar surface 406, a first upper sidewall 408, a second upper sidewall 410, and an upper front wall 412. The first upper sidewall 408, and the second upper sidewall 410 have a first thickness "T1". The first upper sidewall 408, the second upper sidewall 410 and the upper front wall 412 extend perpendicularly along a first height "H1" of the first rectangular upper component 402 from the first planar surface 406 at the first perimeter "P1". According to an exemplary embodiment, the upper front wall 412 of the first rectangular upper component 402 of the coupling modular 208 also includes at least one upper protrusion 414 and at least one upper cut out 416 that are centrally located relative to a distance between the first upper sidewall 408 and the second upper sidewall 410 of the respective rectangular upper component 402. Each of the at least one upper protrusion 414 and at least one upper cut out 416 extends in a direction of the first thickness "T1" of the first rectangular upper component 402.

The first rectangular upper component 402 defines a first slot 430 extending along a portion of a first width "W1" thereof. The first rectangular upper component 402 also defines a first upper pocket 434 and a second upper pocket 436 located at either side of the at least one upper protrusion 414 and at least one upper cut out 416. Each of the first upper pocket 434 and the second upper pocket 436 are identical and are defined along the first height "H1", such that a depth of each pocket 434, 436 is less than first height "H1" of the first rectangular upper component 402. For example, a cut-section C1-C1' shows that a depth "M1" of the second upper pocket 436 is less than the first height "H1" as shown in FIG. 4A.

Referring to FIG. 4B, the first rectangular lower component 404 includes a second perimeter "P2", a second planar surface 418, a first lower sidewall 420, a second lower sidewall 422, and a lower front wall 424. The first lower sidewall 420, and a second lower sidewall 422 have a second thickness equal to the first thickness "T1". As such, the second thickness is also referenced as "T1" in the figures and the description. The first lower sidewall 420, the second lower sidewall 422, and the lower front wall 424 extend perpendicularly along a second height "H2" of the first rectangular lower component 404 from the second planar surface 418 at the second perimeter "P2". The lower front wall 424 of the first rectangular lower component 404 of the coupling modular 208 also includes at least one lower protrusion 426 and at least one lower cut out 428 that are centrally located relative to a distance between the first lower sidewall 420 and the second lower sidewall 422 of the respective rectangular upper component 404. Each of the at least one lower protrusion 426 and at least one lower cut out 428 extends in a direction of the second thickness "T1" of the first rectangular lower component 404.

The first rectangular lower component 404 of FIG. 4B defines a second slot 432 extending along a portion of a second width "W2" thereof. The first rectangular lower component 404 also defines a first lower pocket 438 and a second lower pocket 440 to either side of the at least one lower protrusion 426 and at least one lower cut out 428. Each of the first lower pocket 438 and the second lower pocket 440 are identical and are defined along the second height "H2", such that a depth of each pocket 438, 440 is less than second height "H2" of the first rectangular lower component 404. For example, a cut-section C2-C2' shows that a depth "M2" of the second lower pocket 440 is less than the second height "H2" as shown in FIG. 4B. In some embodiments, each of the first upper pocket 434, and the second upper pocket 436 may be located in a range, but not limited to, of about 0.1 cm to about 0.5 cm from a surface of the upper front wall 412 of the rectangular upper component 402 of the coupling module 208. The first lower pocket 438, and the second lower pocket 440 may be located in a range, but not limited to, of about 0.1 cm to about 0.5 cm from a surface of the lower front wall 424 of the rectangular upper component 404 of the coupling module 208. According to an exemplary embodiment, each of the first upper pocket 434, the second upper pocket 436, the first lower pocket 438, and the second lower pocket 440 has equal width, equal depth and equal height.

The first rectangular upper component 402 is configured to removably couple with the first rectangular lower component 404. For the purpose of such coupling, the first rectangular upper component 402 may be aligned with the first rectangular lower component 404, such that the respective sidewalls and the respective front walls are aligned with each other. In an embodiment, the first thickness "T1" of the first rectangular upper component 402 may be equal to the second thickness "T1" of the first rectangular lower component 404, so that the respective sidewalls and the respective front walls define uniform surfaces at respective sides when the first rectangular upper component 402 is coupled with the first rectangular lower component 404.

In the coupled state, the at least one upper protrusion 414 aligns with the at least one lower protrusion 426 to define a first pin 342 (see FIG. 3). Similarly, the at least one upper cut out 416 aligns with the at least one lower cut out 428 to define notch 344 (see FIG. 3). As illustrated in FIG. 4A and FIG. 4B, the first rectangular upper component 402 defines one upper protrusion 414 and two cut outs 416. The first rectangular lower component 404 defines one lower protrusion 426 and two cut outs 428. In the coupled state, the upper protrusion 414 and the lower protrusion 426 together forms a pin structure to define the first pin 342. Similarly, a first upper cut out 416-1 aligns with a first lower cutout 428-1 to define a first notch 344-1 and a second upper cut out 416-2 aligns with a second lower cut out 428-2 to define a second notch 344-2 as shown in FIG. 3. The first pin 342, the first notch 344-1, and the second notch 344-2 together define the first pin joint 216 of the third coupling module 212. Additionally, in the coupled state, the first upper pocket 434 aligns with the first lower pocket 438 and the second upper pocket 436 aligns with the second lower pocket 440.

Further, the first coupling module 208 includes a first magnet 446 and a second magnet 448. Each of the first magnet 446 and a second magnet 448 has a magnet width equal to the pocket width, a magnet thickness equal to the pocket breadth and a magnet height equal to twice the pocket depth. As used herein, the term "pocket width" refers to a dimension considered along the width of the first coupling module 208, the term "pocket breadth" refers to a dimension considered in a direction perpendicular to the width of the first coupling module 208, and the term "pocket depth" refers a dimension considered along respective front walls.

Owing to such dimensions of the magnets and the pockets, the first magnet 446 is configured to be rigidly inserted into the first lower pocket 438 such that a portion of the first magnet 446 lies outside the first lower pocket 438, and the second magnet 448 is configured to be rigidly inserted into the second lower pocket 440 such that a portion of the second magnet 448 lies outside the second lower pocket 440. The portion of the first magnet 446 extending outside the first lower pocket 438 is configured to be received within the first upper pocket 434 and the portion of the second magnet 448 extending outside the second lower pocket 440 is configured to be received within the second upper pocket 436, when the first rectangular upper component 402 is coupled to the first rectangular lower component 404. Such arrangement of the magnets and the pockets holds the first rectangular upper component 402 and the first rectangular lower component 404 together.

In some embodiments, the first lower pocket 438 may be defined for a larger width along the width "W2" of the first rectangular lower component 404 and accordingly length of the first magnet 446 may be increased to completely occupy the first lower pocket 438. In some embodiments, the second lower pocket 440 and the second magnet 448 may also extend for greater width along the width "W2" of the first rectangular lower component 404. In some embodiments, the second planar surface 418 may include multiple magnets in form of pellets located along the width "W2" of the first rectangular lower component 404. In some embodiments, a surface of the first rectangular upper component 402 configured to abut with the second planar surface 418 may include a metal strip to magnetically couple with the first magnet 446 and the second magnet 448, thereby securing the first rectangular upper component 402 with the first rectangular lower component 404 in the coupled state. In an alternative embodiment, the magnet may be lined on all but its front facing side with steel, carbon steel or iron to form a keeper to increase the strength of the magnetic field as seen at the front face of the coupling module 208.

Further, in the coupled state, the first slot 430 and the second slot 432 together define the first cavity 302 (also referred to as the first interior cavity in the present disclosure) configured to removably receive the first end 304 of the solar cell assembly 200. In some embodiments, the first cavity 302 may be configured to receive first ends of two solar cell assemblies. In such arrangement, the width of the first coupling module 208 may be increased to accommodate two solar cell assemblies.

In an embodiment, each of the first magnet 446 and the second magnet 448 may be neodymium magnet. In an embodiment, the first magnet 446 may have a positive polarity and the second magnet 448 may have a negative polarity with respect to the upper front wall 412 of the first coupling module 208.

According to an exemplary embodiment, the first rectangular lower component 404 includes a first lower socket casing 450 located between the first lower pocket 438 and a first edge 452 of the first rectangular lower component 404, where the first edge 452 extends in the direction of the second thickness "T1". The first lower socket casing 450 is defined by an indentation in the lower front wall 424, where the indentation has a first depth "D1". In an embodiment, the first lower socket casing 450 defines an opening (not shown) configured to receive an electrical connection ribbon of an adjacent solar panel module 102. A ribbon in a socket of a first modular solar cell assembly is electrically connected to a ribbon in a plug of a second modular solar cell assembly by using notch and magnetic field compression. The first rectangular lower component 404 also includes a first lower plug casing 454 located between the second lower pocket 440 and a second edge 456 of the first rectangular lower component 404. The second edge 456 is parallel to the first edge 452 and the first lower plug casing 454 extends for a first length "L1" from the lower front wall 424 in the direction of the second thickness "T1". In an embodiment, the first depth "D1" of the first lower socket casing 450 is equal to the first length "L1" of the first lower plug casing 454.

Figure 5A:
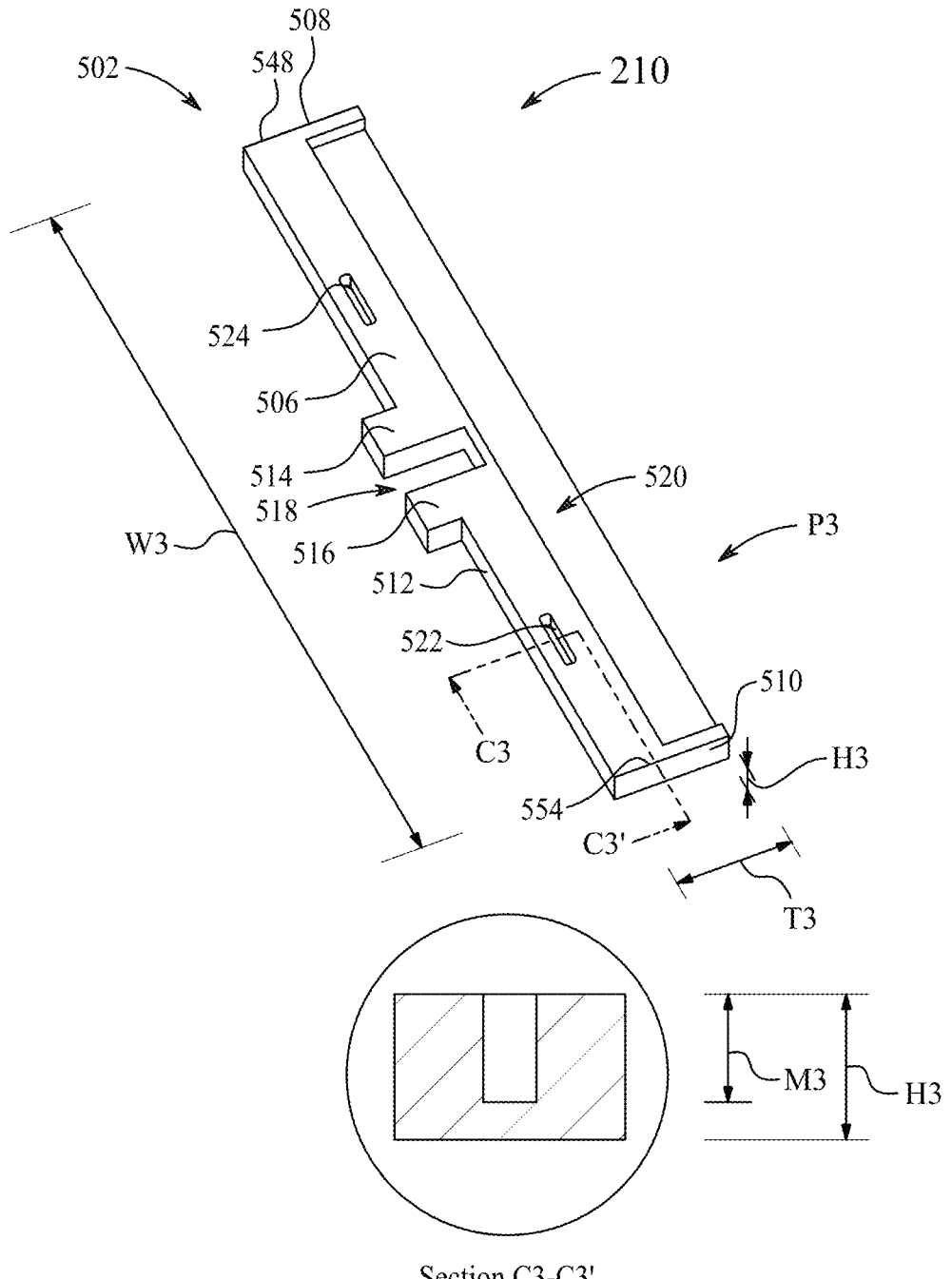
FIG. 5A is a perspective view of a second rectangular upper component of a second coupling module of the solar panel module of FIG. 3, according to certain embodiments of the present disclosure.
Figure 5B:
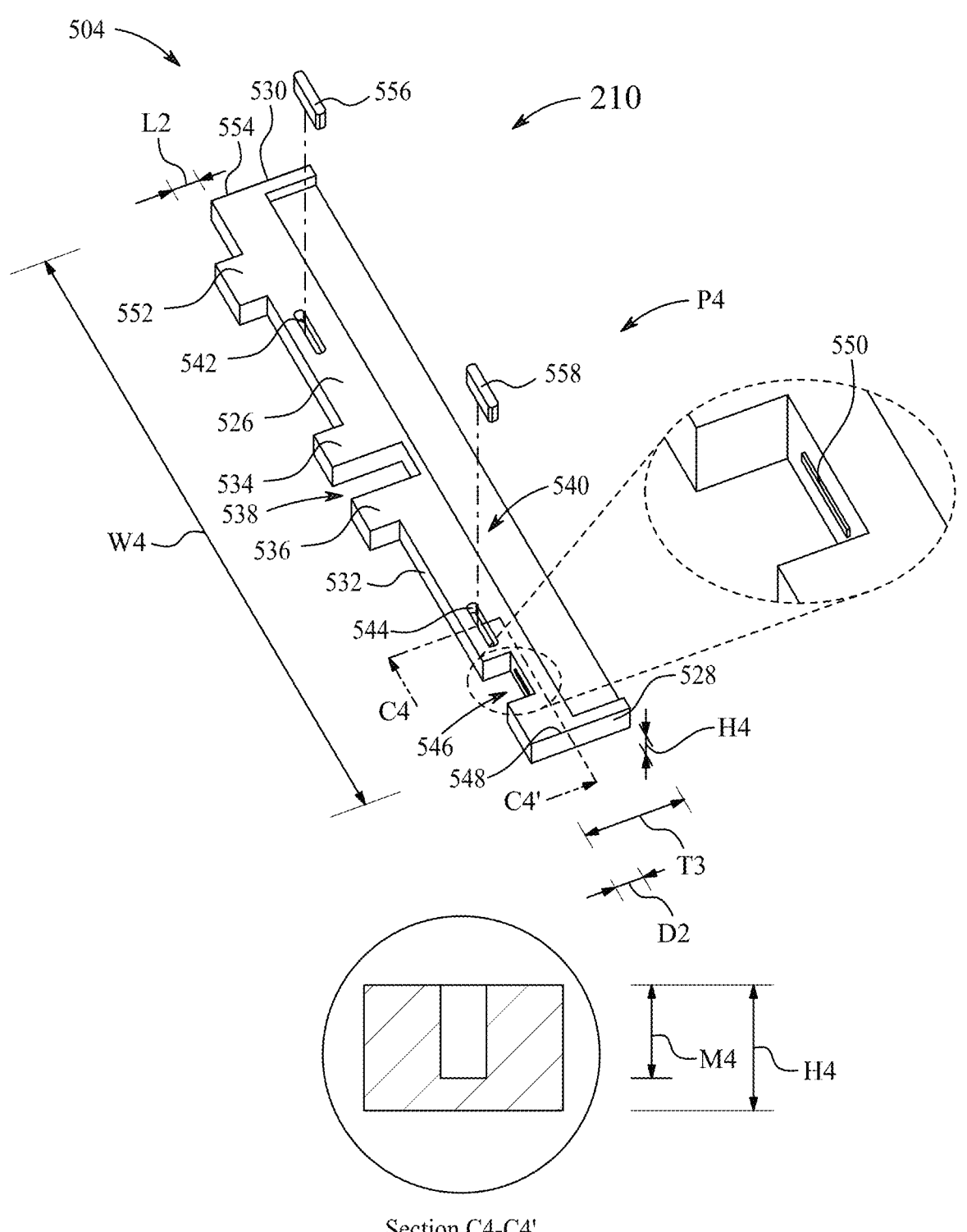
FIG. 5B illustrates an exploded view a second rectangular lower component of the second coupling module of FIG. 3, according to certain embodiments of the present disclosure.

FIG. 5A and FIG. 5B illustrate components of the second coupling module 210. The second coupling module 210 is constituted by removably coupling two individual components. FIG. 5A illustrates a perspective top view of a second rectangular upper component 502 of the second coupling module 210 and FIG. 5B illustrates a perspective view of a second rectangular lower component 504 of the second coupling module 210.

The second rectangular upper component 502 includes a third perimeter "P3", a third planar surface 506, a first upper sidewall 508, a second upper sidewall 510, and an upper front wall 512 having a third thickness "T3". The first upper sidewall 508, the second upper sidewall 510 and the upper front wall 512 extend perpendicularly along a third height "H3" of the second rectangular upper component 502 from the third planar surface 506 at the third perimeter "P3". According to an exemplary embodiment, the second rectangular upper component 502 also includes a first upper protrusion 514 and a second upper protrusion 516 centrally located on an exterior of the upper front wall 512. Each of the first upper protrusion 514 and a second upper protrusion 516 extends in a direction of the third thickness "T3". The second rectangular upper component 502 also defines an upper cut out 518 centrally located on the exterior of the upper front wall 512. Particularly, the upper cut out 518 is located in between the first upper protrusion 514 and the second upper protrusion 516. In an embodiment, the first upper protrusion 514 and the second upper protrusion 516 may be symmetrical about the upper cut out 518. In some embodiments, the first upper protrusion 514 and the second upper protrusion 516 may be located distant from each other. In some embodiments, the second rectangular upper component 502 may include multiple protrusions and multiple cut outs to add to the stability of the interlocking between the solar panel modules 102.

Additionally, the second rectangular upper component 502 defines a third slot 520 extending along a portion of a third width "W3" thereof; and a first upper pocket 522 and a second upper pocket 524 located on either side of the protrusions 514, 516 and the upper cut out 518. Each of the first upper pocket 522 and the second upper pocket 524 are identical and are defined along the third height "H3", such that a depth of each pocket 522, 524 is less than third height "H3" of the second rectangular upper component 502. For example, a cut-section 'C3-C3' shows that a depth "M3" of the second upper pocket 524 is less than the third height "H3" as shown in FIG. 5A.

Referring to FIG. 5B, the second rectangular lower component 504 includes a fourth perimeter "P4", a fourth planar surface 526, a first lower sidewall 528, a second lower sidewall 530, and a lower front wall 532 having a fourth thickness equal to the third thickness "T3". As such, the fourth thickness is also referenced as "T3" in the figures and the description. The first lower sidewall 528, the second lower sidewall 530 and the lower front wall 532 extend perpendicularly along a fourth height "H4" of the second rectangular lower component 504 from the fourth planar surface 526 at the fourth perimeter "P4". The second rectangular lower component 504 also includes a first lower protrusion 534 and a second lower protrusion 536 centrally located on an exterior of the lower front wall 532. Each of the first lower protrusion 534 and a second upper protrusion 536 extends in a direction of the fourth thickness "T3". The second rectangular lower component 504 also defines a lower cut out 538 centrally located on the exterior of the lower front wall 532. Particularly, the lower cut out 538 is located in between the first lower protrusion 534 and the second lower protrusion 536.

Additionally, the second rectangular lower component 504 defines a fourth slot 540 extending along a portion of a fourth width "W4" thereof; and a first lower pocket 542 and a second lower pocket 544 located on either side of the protrusions 534, 536 and the lower cut out 538. Each of the first lower pocket 542 and the second lower pocket 544 are identical and are defined along the fourth height "H4", such that a depth of each pocket 542, 544 is less than fourth height "H4" of the second rectangular lower component 504. For example, a cut-section 'C4-C4' shows that a depth "M4" of the second lower pocket 544 is less than the third height "H4" as shown in FIG. 5B.

According to an exemplary embodiment, the second rectangular lower component 504 includes a second lower socket casing 546 located between the first lower pocket 542 and a first edge 548 of the second rectangular lower component 504, where the first edge 548 extends in the direction of the fourth thickness "T3". The second lower socket casing 546 is defined by an indentation in the lower front wall 532, where the indentation has a second depth "D2". In an embodiment, the second lower socket casing 546 defines an opening 550 configured to receive an electrical connection ribbon of an adjacent solar panel module 102.

The second rectangular lower component 504 also includes a second lower plug casing 552 located between the second lower pocket 544 and a second edge 554 of the second rectangular lower component 504. The second edge 554 is parallel to the first edge 548 and the second lower plug casing 552 extends for a second length "L2" from the lower front wall 532 in direction of the fourth thickness "T3". In an embodiment, the second depth "D2" of the second lower socket casing 546 is equal to the second length "L2" of the second lower plug casing 552.

The second rectangular upper component 502 is configured to removably couple with the second rectangular lower component 504 to constitute the second coupling module 210 (as can be seen in FIG. 3). Further, the second coupling module 210 includes a third magnet 556 and a fourth magnet 558. Each of the third magnet 556 and the fourth magnet 558 has a magnet width equal to the pocket width, a magnet depth thickness to the pocket breadth and a magnet height equal to twice the pocket height. Owing to such dimensions of the magnets and the pockets, the third magnet 556 is configured to be rigidly inserted into the first lower pocket 542 such that a portion of the third magnet 556 lies outside the first lower pocket 542, and the fourth magnet 558 is configured to be rigidly inserted into the second lower pocket 544 such that a portion of the fourth magnet 558 lies outside the second lower pocket 544. The portion of the third magnet 556 extending outside the first lower pocket 542 is configured to be received within the first upper pocket 522 and the portion of the fourth magnet 558 extending outside the second lower pocket 544 is configured to be received within the second upper pocket 524 when the second rectangular upper component 502 is coupled to the second rectangular lower component 504. Such arrangement of the magnets and the pockets serves to hold the second rectangular upper component 502 and the second rectangular lower component 504 firmly together and helps align the upper and lower components. Further, in the coupled state, the third slot 520 and the fourth slot 540 together defines the second cavity 306 (also referred to as second interior cavity in the present disclosure) configured to removably receive the second end 308 of the solar cell assembly 200.

In an embodiment, each of the third magnet 556 and the fourth magnet 558 may be neodymium magnet. In an embodiment, the third magnet 556 may have a negative polarity and the fourth magnet 558 may have a positive polarity with respect to the upper front wall 512 of the second coupling module 210. It will be apparent to the person skilled in the art that the embodiments described with respect to the first magnet 446 and the second magnet 448 in FIG. 4B may be implemented to the second rectangular lower component 504.

In a coupled state of the second rectangular upper component 502 and the second rectangular lower component 504, the first upper protrusion 514 aligns and abuts with the first lower protrusion 534 to define a second pin 360 (see FIG. 3). The second upper protrusion 516 aligns and abuts with the second lower protrusion 536 to define a third pin 362 (see FIG. 3). The upper cut out 518 aligns with the lower cut out 538 to define a third notch 364 (see FIG. 3). In an embodiment, the second pin 360, the third pin 362, and the third notch 364 together constitutes the second pin joint 218 (see FIG. 2B).

In an embodiment, each component of the first coupling module 208 and the second coupling module 210 of the first solar panel module 102-1 may be 3D printed from a plastic selected from the group comprising polyaryletherketone, polyetherimide, polyether ether ketone ketone and polyether ether ketone, preferably polyether ether ketone. In some embodiments, the 3D printing may be performed using resins, thermoplastics, polycarbonate, carbon fibers, gas-filled polymers, acrylonitrile styrene acrylate (ASA), engineering plastic, or a combination of one or more thereof, or any other material known to a person skilled in the art.

Accordingly, construction of the first solar panel module 102-1 is described. Each solar panel module 102 of the modular solar panel 100 is identical in construction to the first solar panel module 102-1. For example, referring to FIG. 2A and FIG. 2B, the third coupling module 212 of the second solar panel module 102-2 is identical to the first coupling module 208 of the first solar panel module 102-1, and the fourth coupling module 214 of the second solar panel module 102-2 is identical to the second coupling module 210 of the first solar panel module 102-1. As such, the first pin joint 220 of the third coupling module 212 of the second solar panel module 102-2 is configured to interlock with the second pin joint 218 of the second coupling module 210 of the first solar panel module 102-1.

Figure 5C:
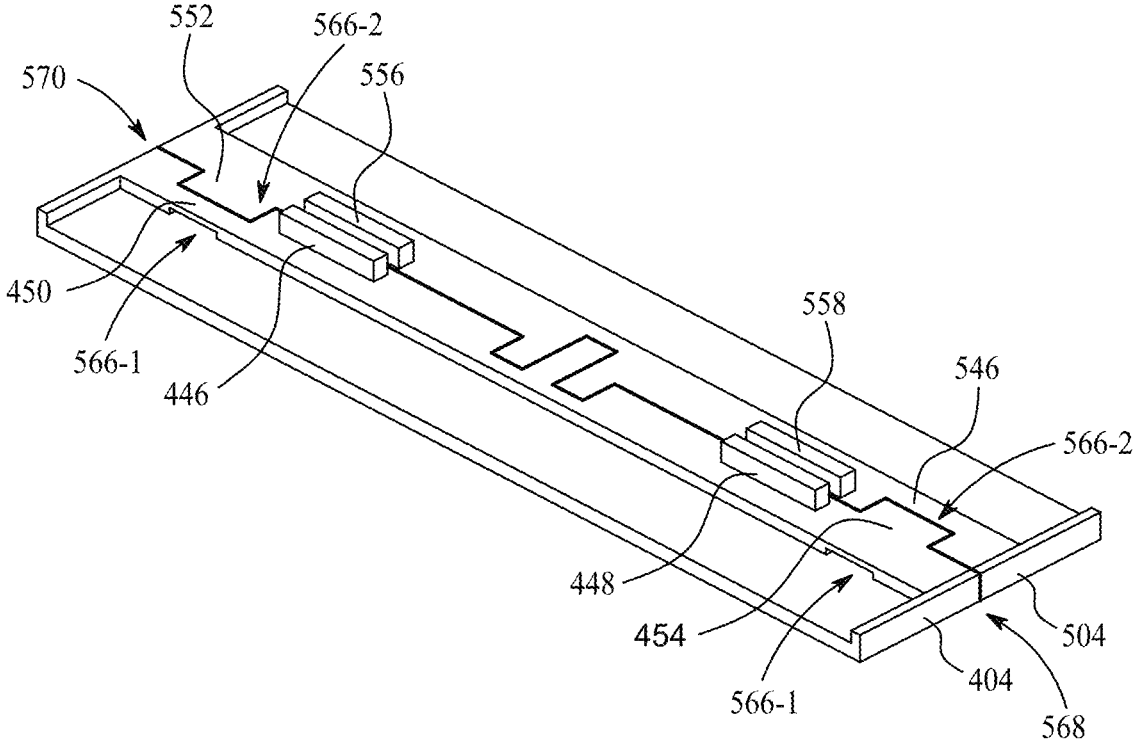
FIG. 5C depicts alignment of the two interconnected solar panel modules, according to certain embodiments of the present disclosure.

FIG. 5C illustrates a schematic cross-sectional view of the interlock between the first solar panel module 102-1 and the second solar panel module 102-2 as shown from the interior of two lower components. In an embodiment, the third magnet 556 may have the negative polarity and the fourth magnet 558 may have the positive polarity. The first magnet 446 of the third coupling module 212 of the second solar panel module 102-2 may have a positive polarity and the second magnet 448 may have a negative polarity. As such, when the third coupling module 212 of the second solar panel module 102-2 is located in proximity to the second coupling module 210 of the first solar panel module 102-1, the second rectangular lower component 504 aligns with the first rectangular lower component 404 owing to the attracting polarities of the magnets. As such, the alignment of the solar panel module 102 may be quickly achieved without investing additional manual effort. Such alignment of the solar panel modules 102 also helps to achieve the interlock between the solar panel modules 102.

In an embodiment, each coupling module of the solar panel modules 102 includes an electrical connection port 566 configured to receive one of the first electrical connection ribbon 314 and the second electrical connection ribbon 318. In an embodiment, a first electrical connection port 566-1 of the first coupling module 208 is configured to electrically connect to a second electrical connection port 566-2 of the second coupling module 210.

According to an exemplary embodiment, an electrical plug 568 is formed by connecting the first lower plug casing 454 of the third coupling module 212 of the second solar panel module 102-2 with the second lower socket casing 546 of the second coupling module 210 of the first solar panel module 102-1. Similarly, an electrical socket 570 is formed by connecting the first lower socket casing 450 with the second lower plug casing 552. The electrical socket 570 and the electrical plug 568 allows extraction of electrical power from the modular solar panel 100.

FIG. 6A illustrates a flowchart of a method 600 for assembling the modular solar panel 100, according to certain embodiments of the present disclosure. The method 600 will be described in conjunction with the FIG. 1 through FIG. 5C. The method 600 is directed towards forming the first solar panel module 102-1. At step 602, the method 600 includes forming the first solar cell assembly 200 by sandwiching the first solar cell array 206 between the first protective glass 202 and the first base plate 204, so that the first electrical connection ribbon 314 extends from the first end 316 of the first solar cell array 206, and the second electrical connection ribbon 318 extends from the second end 320, which is opposite to the first end 316, of the first solar cell array 206.

At step 604, the method 600 includes joining the first rectangular upper component 402 to the first rectangular lower component 404 to form the first coupling module 208 having the first interior cavity 302, the first electrical connection port 566-1, a first electrical connection socket and the first pin joint 216 having one pin and two notches.

At step 606, the method 600 includes joining the second rectangular upper component 502 to the second rectangular lower component 504 to form the second coupling module 210 having the second interior cavity 306, the second electrical connection port 566-2, a second electrical connection socket and the second pin joint 218 having two pins and one notch.

At step 608, the method 600 includes inserting the first end 304 of the first solar cell assembly 200 into the first interior cavity 302 of the first coupling module 208 while guiding the first electrical connection ribbon 314 into the first electrical connection port 566-1.

At step 610, the method 600 includes inserting the second end 308 of the first solar cell assembly 200 into the second interior cavity 306 of the second coupling module 210 while guiding the second electrical connection ribbon 318 into the second electrical connection socket.

Although not illustrated through steps in FIG. 6A, the method 600 further includes joining the first rectangular upper component 402 to the first rectangular lower component 404. This is performed by inserting a first portion of the first magnet 446 in the first upper pocket 434 and a first portion of the second magnet 448 into the second upper pocket 436 of the first rectangular upper component 402 of the first coupling module 208, 212. The method 600 further includes inserting a second portion of the first magnet 446 into the first lower pocket 438 and a second portion of the second magnet 448 into the second lower pocket 440 of the first rectangular lower component 402 of the first coupling module 208, 212.

The method 600 further includes joining the second rectangular upper component 502 to the second rectangular lower component 504. This is performed by inserting a third portion of the third magnet 556 into the third upper pocket 522 and a fourth portion of the fourth magnet 558 into a fourth upper pocket 436 of the second rectangular upper component 502 of a third coupling module. The method 600 further includes inserting a third portion of the third magnet 556 into a third lower pocket 438 and a fourth portion of the fourth magnet 558 into a fourth lower pocket 440 of the second rectangular lower component 504 of the third coupling module.

FIG. 6B is a flowchart of a method 650 for assembling the modular solar panel 100 and forming the second solar panel module 102-2, according to certain embodiments of the present disclosure. In an embodiment, the second solar panel module 102-2 is identical in construction to the first solar panel module 102-1. At step 652, the method 650 includes forming the second solar cell assembly 200 by sandwiching the second solar cell array between a second protective glass and a second base plate, so that a third electrical connection ribbon extends from a first end of the second solar cell array and a fourth electrical connection ribbon extends from a second, opposite end of the second solar cell array.

At step 654, the method 650 includes joining a third rectangular upper component to a third rectangular lower component to form a third coupling module having a third interior cavity, a third electrical connection port, a third electrical connection socket and a third pin joint having two pins and one notch.

At step 656, the method 650 includes joining a fourth rectangular upper component to a fourth rectangular lower component to form a fourth coupling module having a fourth interior cavity, a fourth electrical connection port, a fourth electrical connection socket and a fourth pin joint having one pin and two notches.

At step 656, the method 650 includes inserting the first end of the second solar cell assembly into the third interior cavity of the third coupling module while guiding the third electrical connection ribbon into the third electrical connection port.

At step 660, the method 650 includes inserting the second end of the second solar cell assembly into a fourth interior cavity of a fourth coupling module while guiding the fourth electrical connection ribbon into the fourth electrical connection port socket.

Although not illustrated through steps in FIG. 6B, the method 650 further includes joining the third rectangular upper component to the third rectangular lower component. This is performed by inserting a first portion of a fifth magnet into a fifth upper pocket and a first portion of a sixth magnet into a sixth upper pocket of the third rectangular upper component of the third coupling module. The method 650 also includes inserting a second portion of the fifth magnet into a fifth lower pocket and a second portion of the sixth magnet into a sixth lower pocket of the third rectangular lower component of the third coupling module.

The method 650 also includes joining the fourth rectangular upper component to the fourth rectangular lower component. This is performed by inserting a first portion of a seventh magnet into a seventh upper pocket and a first portion of an eighth magnet into an eighth upper pocket of the fourth rectangular upper component of the fourth coupling module. The method 650 also includes inserting a second portion of the seventh magnet into a seventh lower pocket and a second portion of the eighth magnet into an eighth lower pocket of the fourth rectangular lower component of the fourth coupling module.

The method 650 further includes inserting the first magnet into the first upper pocket of the first upper component with a positive polarity towards a first upper front wall.

The method 650 further includes inserting the second magnet into the second upper pocket of the first upper component with a negative polarity towards the first upper front wall.

The method 650 further includes inserting the third magnet into the third upper pocket of the second upper component with a positive polarity towards a second upper front wall.

The method 650 further includes inserting the fourth magnet into the fourth upper pocket of the second upper component with a negative polarity towards the second upper front wall.

The method 650 further includes inserting the fifth magnet into the first upper pocket of the third upper component with a positive polarity towards a third upper front wall.

The method 650 further includes inserting the sixth magnet into the second upper pocket of the third upper component with a negative polarity towards the third upper front wall.

The method 650 further includes inserting the seventh magnet into the first upper pocket of the fourth upper component with a positive polarity towards a fourth upper front wall.

The method 650 further includes inserting the eighth magnet into the second upper pocket of the fourth upper component with a negative polarity towards the fourth upper front wall.

FIG. 6C is a flowchart of a method 690 for assembling the modular solar panel 100 with the first solar panel module and the second solar panel module. At step 692, the method 690 includes connecting the first solar panel module 102-1 to the second solar panel module 102-2 by inserting the first pin joint 216 into the fourth pin joint, the first electrical connection port into the fourth electrical connection socket and the first electrical connection socket into the fourth electrical connection port.

At step 694, the method 690 includes aligning the first solar panel module 102-1 with the second solar panel module 102-2 by magnetically contacting the first magnet 446 of the first coupling module 210 to the fourth magnet of a second coupling module and magnetically contacting the second magnet of the first coupling module to the third magnet of the second coupling module.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A method for assembling a modular solar panel, comprising:
   forming a first solar panel module by:
      forming a first solar cell assembly by sandwiching a first solar cell array between a first protective glass and a first base plate, so that a first electrical connection ribbon extends from a first end of the first solar cell array and a second electrical connection ribbon extends from a second, opposite end of the first solar cell array, wherein the first solar cell array comprises a plurality of rows of solar cells electrically connected by a metal interconnect layer;
   joining a first rectangular upper component to a first rectangular lower component to form a first coupling module having a first interior cavity, a first electrical connection port, a first electrical connection socket and a first pin joint having two pins and one notch;
   joining a second rectangular upper component to a second rectangular lower component to form a second coupling module having a second interior cavity, a second electrical connection port, a second electrical connection socket and a second pin joint having one pin and two notches;
   inserting the first end of the first solar cell assembly into the first interior cavity of the first coupling module while guiding the first electrical connection ribbon into the first electrical connection port; and
   inserting the second end of the first solar cell assembly into the second interior cavity of the second coupling module while guiding the second electrical connection ribbon into the second electrical connection socket.

2. The method of claim 1, further comprising:
   joining the first rectangular upper component to the first rectangular lower component by:
   inserting a first portion of a first magnet in a first upper pocket and a first portion of a second magnet into a second upper pocket of the first rectangular upper component of the first coupling module;
   inserting a second portion of the first magnet into a first lower pocket and a second portion of the second magnet into a second lower pocket of the first rectangular lower component of the first coupling module;
   joining the second rectangular upper component to the second rectangular lower component by:
   inserting a third portion of a third magnet into a third upper pocket and a third portion of a fourth magnet into a fourth upper pocket of a second rectangular upper component of a third coupling module; and
   inserting a fourth portion of the third magnet into a third lower pocket and a fourth portion of the fourth magnet into a fourth lower pocket of the second rectangular lower component of the third coupling module.

3. The method of claim 2, further comprising:
   forming a second solar panel module by:
      forming a second solar cell assembly by sandwiching a second solar cell array between a second protective glass and a second base plate, so that a third electrical connection ribbon extends from a first end of the second solar cell array and a fourth electrical connection ribbon extends from a second, opposite end of the second solar cell array;
      joining a third rectangular upper component to a third rectangular lower component to form a third coupling module having a third interior cavity, a third electrical connection port, a third electrical connection socket and a third pin joint having two pins and one notch;
      joining a fourth rectangular upper component to a fourth rectangular lower component to form a fourth coupling module having a fourth interior cavity, a fourth electrical connection port, a fourth electrical connection socket and a fourth pin joint having one pin and two notches;
      inserting the first end of the second solar cell assembly into the third interior cavity of the third coupling module while guiding the third electrical connection ribbon into the third electrical connection port; and inserting the second end of the second solar cell assembly into a fourth interior cavity of a fourth coupling module while guiding the fourth electrical connection ribbon into the fourth electrical connection socket.

4. The method of claim 3, further comprising:

joining the third rectangular upper component to the third rectangular lower component by:

inserting a first portion of a fifth magnet into a fifth upper pocket and a first portion of a sixth magnet into a sixth upper pocket of the third rectangular upper component of the third coupling module;

inserting a second portion of the fifth magnet into a fifth lower pocket and a second portion of the sixth magnet into a sixth lower pocket of the third rectangular lower component of the third coupling module;

joining the fourth rectangular upper component to the fourth rectangular lower component by:

inserting a first portion of a seventh magnet into a seventh upper pocket and a first portion of an eighth magnet into an eighth upper pocket of the fourth rectangular upper component of the fourth coupling module; and inserting a second portion of the seventh magnet into a seventh lower pocket and a second portion of the eighth magnet into an eighth lower pocket of the fourth rectangular lower component of the fourth coupling module.

5. The method of claim 4, further comprising:

inserting the first magnet into the first upper pocket of the first upper component with a positive polarity towards a first upper front wall;

inserting the second magnet into the second upper pocket of the first upper component with a negative polarity towards the first upper front wall; and inserting the third magnet into the third upper pocket of the second upper component with a positive polarity towards a second upper front wall;

inserting the fourth magnet into the fourth upper pocket of the second upper component with a negative polarity towards the second upper front wall;

inserting the fifth magnet into the first upper pocket of the third upper component with a positive polarity towards a third upper front wall;

inserting the sixth magnet into the second upper pocket of the third upper component with a negative polarity towards the third upper front wall; and inserting the seventh magnet into the first upper pocket of the fourth upper component with a positive polarity towards a fourth upper front wall; and inserting the eighth magnet into the second upper pocket of the fourth upper component with a negative polarity towards the fourth upper front wall.

6. The method of claim 5, further comprising:

connecting the first solar panel module to the second solar panel module by inserting the first pin joint into the fourth pin joint, the first electrical connection port into the fourth electrical connection socket and the first electrical connection socket into the fourth electrical connection port; and aligning the first solar panel module with the second solar panel module by magnetically contacting the first magnet of the first coupling module to the fourth magnet of the second coupling module and magnetically contacting the second magnet of the first coupling module to the third magnet of the second coupling module.

7. The method of claim 1, wherein the first solar cell assembly includes:

the first solar cell array, the first protective glass, the first coupling module, the second coupling module, and the first base plate, two or more magnets are removably embedded in the first and second coupling modules; and wherein the pin joint of the first coupling module is interlocked with the pin joint of the second coupling module.

8. The method of claim 5, wherein each of the first upper pocket and the second upper pocket is located within 0.1 cm to 0.5 cm of a surface of the upper front wall of the rectangular upper component of a respective coupling module; and wherein each of the first lower pocket and the second lower pocket is located within 0.1 cm to 0.5 cm of a surface of the lower front wall of the rectangular lower component of the respective coupling module.

* * * * *